US007009425B1

(12) United States Patent
Loinaz et al.

(10) Patent No.: US 7,009,425 B1
(45) Date of Patent: Mar. 7, 2006

(54) METHODS AND APPARATUS FOR IMPROVING LARGE SIGNAL PERFORMANCE FOR ACTIVE SHUNT-PEAKED CIRCUITS

(75) Inventors: Marc J Loinaz, Palo Alto, CA (US); Arnold R. Feldman, San Francisco, CA (US)

(73) Assignee: Aeluros, Inc., Mountain View, CA (US)

( * ) Notice: Subject to any disclaimer, the term of this patent is extended or adjusted under 35 U.S.C. 154(b) by 160 days.

(21) Appl. No.: 10/778,635

(22) Filed: Feb. 13, 2004

Related U.S. Application Data

(63) Continuation-in-part of application No. 10/213,484, filed on Aug. 6, 2002, now Pat. No. 6,788,103.

(51) Int. Cl.
*H03K 17/16* (2006.01)
(52) U.S. Cl. ............................. 326/83; 326/121
(58) Field of Classification Search ............ 326/26, 326/27, 82–86, 112, 119, 121
See application file for complete search history.

(56) References Cited

U.S. PATENT DOCUMENTS 5,043,602 A * 8/1991 Flannagan ................. 326/126
6,366,140 B1 * 4/2002 Warwar ..................... 327/108

* cited by examiner

*Primary Examiner*—Don Le
(74) *Attorney, Agent, or Firm*—Stattler Johansen & Adeli, LLP

(57) ABSTRACT

A logic circuit employs a shunt peaked technique to enhance the switching speed of the circuit without an increase in power dissipation. A differential logic gate implements a digital circuit function. The shunt peaked logic circuit includes two resistive and two inductive elements. For each differential output line, a resistive element is coupled in series to an inductive element so as to couple the circuit power supply voltage to a differential output line. Under this configuration, the bandwidth of the logic circuit is increased without an increase in power consumption. The logic circuit may be implemented using CML or ECL logic. Techniques for improving large signal performance for active shunt-peaked circuits are also disclosed.

18 Claims, 7 Drawing Sheets

METHODS AND APPARATUS FOR IMPROVING LARGE SIGNAL PERFORMANCE FOR ACTIVE SHUNT-PEAKED CIRCUITS

CROSS-REFERENCES TO RELATED APPLICATIONS

This application claims the benefit of U.S. patent application Ser. No. 10/213,484, filed Aug. 6, 2002, is now a U.S. Pat. No. 6,788,103, entitled "Active Shunt-Peaked Logic Gates."

BACKGROUND OF THE INVENTION

1. Field of the Invention

The present invention is directed toward the field of circuits, and more particularly toward active shunt-peaked circuits.

2. Art Background

Data communication systems transport data at a speed defined by a predetermined data rate. The speed of transmitting data in modern broadband communication systems has rapidly increased in recent years. Today, data rates as high as 40 giga bits per second ("Gbps") are required for the OC-768 optical networking standard.

These data communication systems include basic digital circuits, such as multiplexors, demultiplexors, and constituent logic gates. Thus, to operate at high data rates, the digital circuits must also switch at high speeds (i.e., the digital circuits require a high bandwidth of operation). In addition to operating at high speeds, the digital circuits must be designed to minimize power dissipation. Excessive power dissipation degrades integrated circuit performance by producing excessive heat.

Typically, high-speed logic circuits are designed based on bipolar emitter-coupled logic ("ECL") or metal oxide semiconductor ("MOS") current-mode logic ("CML"). These logic families operate using differential inputs, clocks and outputs. FIG. 1 illustrates the conventional implementation of a current mode logic latch.

The digital logic circuits must be able to regenerate signals, so that multiple stages of digital circuits may be cascaded. As shown in FIG. 1, the CML latch circuit includes gain resistors $R_{L1}$ and $R_{L2}$. To this end, gain resistors are used on digital logic circuits (e.g., ECL and CML) to maintain a direct current ("DC") voltage swing on the drain of transistors 103, 104, 105, and 106.

One objective in designing high-speed logic circuits is to reduce the resistive-capacitive ("RC") time constant at the output of the logic gate. The RC time constant is a product of the resistance, provided by the gain resistors, and the total capacitance at the output of the logic gate. A large RC time constant results in relatively slow rise times of the output signal voltage. In turn, the slow rise time limits the operating speed of the circuit. Thus, the time constant at the output of the logic gate dictates how fast the logic circuit may operate.

One technique for reducing the time constant in the output of the digital circuits is to reduce the gain resistors (e.g., $R_{L1}$ and $R_{L2}$ for the latch of FIG. 1). However, if smaller gain resistors are used, the current flowing in the device must be increased in order to maintain the requisite voltage swing at the output of the gate. Thus, in order to attain the necessary increase in current, an increase in the device size is required. These larger device sizes, in turn, increase the load capacitance (input capacitance of a subsequent gate as well as drain capacitance internal to the gate), and therefore there is no enhanced speed performance of the gate.

Accordingly, it is desirable to provide digital logic circuits that maintain adequate output drive while switching at very high data rates. It is also desirable to provide digital logic circuits with increased performance that minimize power dissipation, device size and inter-symbol interference.

SUMMARY OF THE INVENTION

A circuit improves large signal performance for active shunt-peaked circuits. The circuit includes at least one output line with the active shunt-peaked circuit coupled to the output line. The active shunt-peaked circuit contains a load transistor that generates an inductance. A core circuit, which processes at least one input signal, generates at least one output signal on the output line. The core circuit may comprise a logic gate or an amplifier. A current source is coupled to the output line so as to prevent the load transistor of the active shunt-peaked circuit from entering a cut-off region of operation. In one embodiment, the current source comprises a transistor, coupled between the output line and ground, and coupled to receive a bias voltage. In another embodiment, the current source comprises a resistor coupled between the output line and ground.

The techniques of the present invention may be applied in a differential circuit. For this embodiment, the output line includes differential output lines and the active shunt-peaked circuit, coupled to the differential output lines, comprises a plurality of load transistors, one for each differential output line. The core circuit generates differential output signals on the differential output lines. For this embodiment, a current source is coupled to each differential output line so as to prevent the load transistors from entering a cut-off region of operation.

The circuit may comprise metal oxide semiconductor (MOS) transistors configured using current-mode logic. In other embodiments, the circuit comprises bipolar transistors configured using emitter-coupled logic.

DETAILED DESCRIPTION

One approach to improve operating bandwidth is known as shunt peaking. In general, with shunt peaking, series inductance is introduced in the path of gain resistors to partially compensate for the load capacitance. This technique results in a bandwidth enhancement of a circuit up to 1.85 times over a circuit that does not tune out the load capacitance. The active shunt peak configuration has only been applied to wideband amplifiers. The present invention uses shunt peaking to improve the speed of high-speed logic gates, such as ECL and CML logic gates. The shunt peaked logic gate switches at very high data rates while maintaining adequate output drive. The shunt peaked logic gate also minimizes power dissipation and device size without performance degradation.

Figure 1:
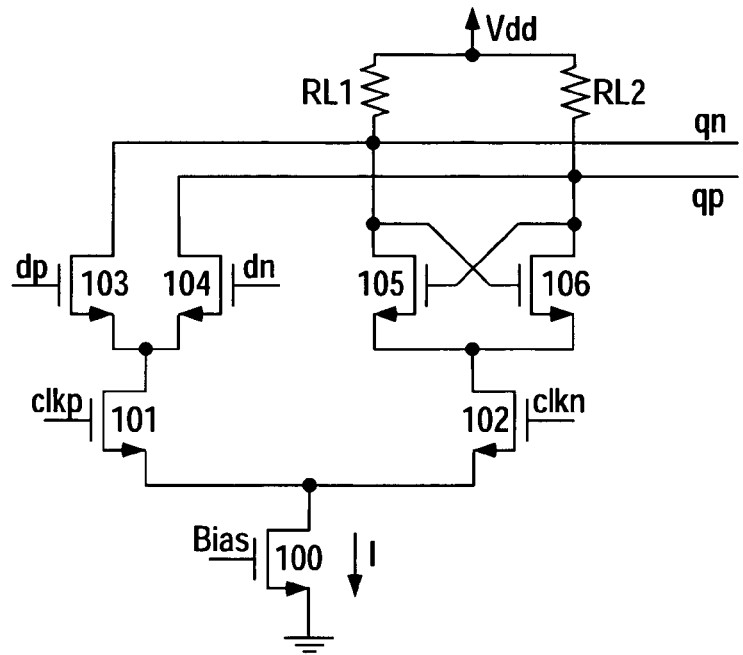
FIG. 1 illustrates the conventional implementation of a current mode logic latch.
Figure 2:
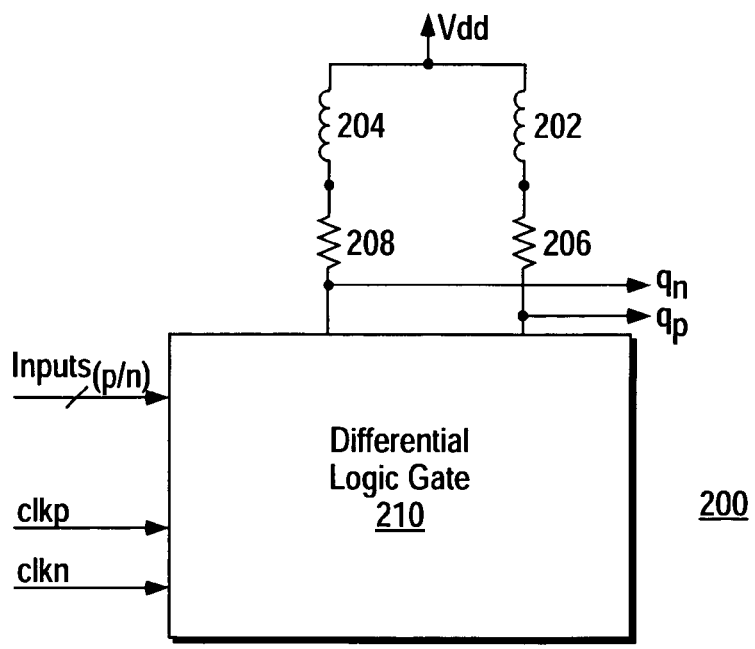
FIG. 2 is a block diagram illustrating the use of a series inductor to tune out the load capacitance of a high-speed logic gate.

FIG. 2 is a block diagram illustrating the use of a series inductor to tune out the load capacitance of a high-speed logic gate. A differential logic gate 210 performs a digital logic function. Differential logic gate 210 may perform any number of know logic functions implemented for a variety of logic families. In one embodiment, logic gate 210 comprises bipolar transistors configured using emitter-coupled logic. In another embodiment, the logic gate 210 comprises MOS transistors configured using current-mode logic. Although the present invention is described for logic gates using ECL or CML logic, any differential logic may be implemented using the techniques of the present invention. As shown in FIG. 2, differential logic gate 210 receives a plurality of differential inputs (p and n) as well as differential clocks, $clk_p$ and $clk_n$. Differential logic gate 210 generates at least one differential output, shown as $q_n$ and $q_p$ on FIG. 2.

For this embodiment, the shunt peaking technique is illustrated through use of inductors 202 and 204. Although FIG. 2 illustrates adding a physical inductor in shunt with the load capacitance at the output of the logic gate, any means for generating inductance may be used without deviating from the spirit or scope of the invention. As shown in FIG. 2, the inductors (202 and 204) are placed in series with the load resistors. Without the series inductance, the bandwidth, and therefore the switching speed of the logic gate, is inversely related to the RC product at the output of the logic gate. The addition of the inductor increases the bandwidth and therefore switching speed of the logic gate by counteracting the decrease in impedance with frequency of the load capacitance. Typically, discrete inductors are physically large. Integrated circuits utilize dense circuit implementations. Thus, the use of discrete inductors is rendered impractical when implementing logic circuits on chips. To minimize die area, the series inductance may be implemented with an active device.

Figure 3:
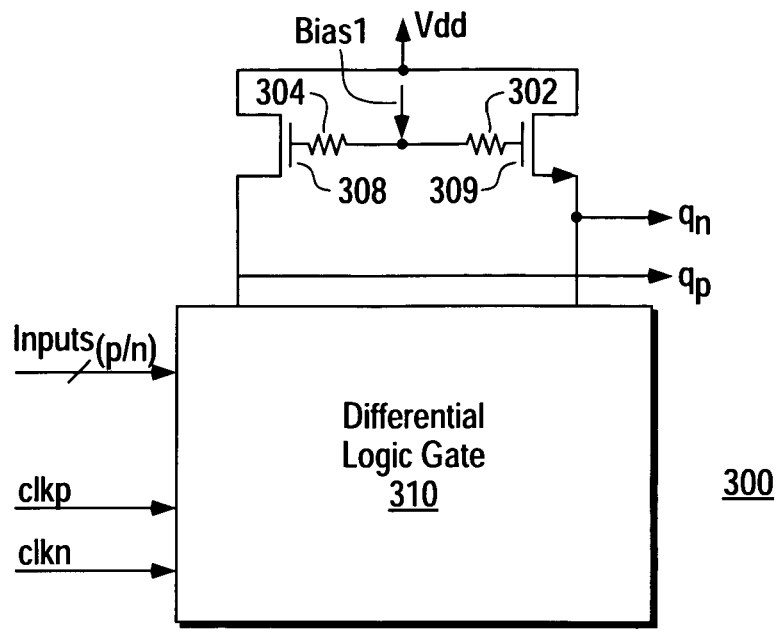
FIG. 3 illustrates one embodiment for introducing series inductance in a high-speed differential logic gate.

In another embodiment, the series inductor may be implemented using a MOS transistor. FIG. 3 illustrates one embodiment for introducing series inductance in a high-speed logic gate. As shown in FIG. 3, resistors (302 and 304) are coupled in parallel to voltage Bias1. In turn, the resistors (302 and 304) are coupled to gates of MOS transistors, 308 and 309. The drains of MOS transistors 308 and 309 are coupled to the power supply voltage, and the source of MOS transistors 308 and 309 are coupled to the output lines. The resistors (302 and 304) and MOS transistors (308 and 309) of the circuit of FIG. 3 provide an active inductance with a value directly proportional to the value of the resistors (302 and 304).

The differential logic gate 310 is biased with constant current. Also, a bias, labeled $Bias_1$ on FIG. 3, is used to set the DC voltage at the gates of MOS transistors 308 and 309 at a threshold voltage above the power supply voltage, $V_{dd}$. In one embodiment, the biasing for the CMOS implementation is accomplished with a modern process that utilizes two voltages: a standard lower voltage, $V_{dd}$, used to power the core of an integrated circuit, and a higher voltage used to power the I/O circuits. The impedance, which may be calculated by conducting a small signal analysis of the circuit of FIG. 3, is equivalent to the impedance of an inductor.

Figure 4:
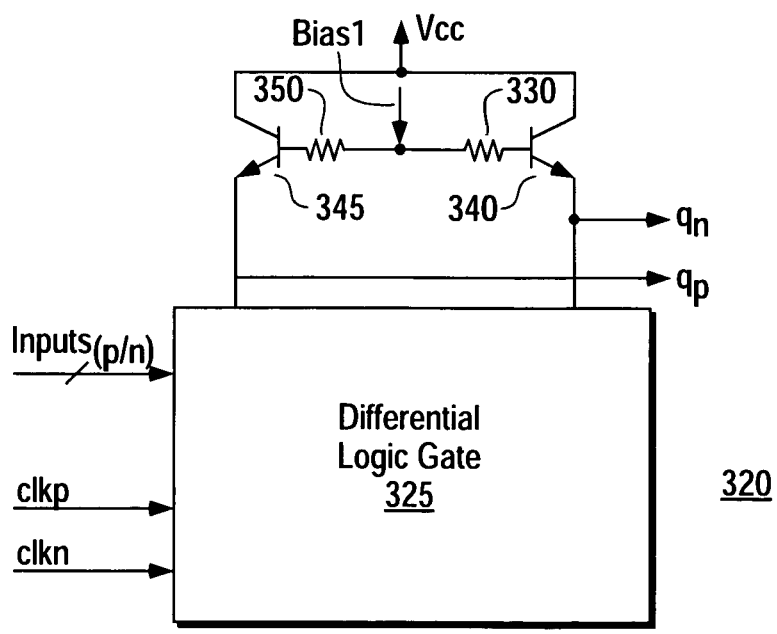
FIG. 4 illustrates a second embodiment for introducing series inductance in a high-speed differential logic gate.

FIG. 4 illustrates a second embodiment for introducing series inductance in a high-speed differential logic gate. For this embodiment, the active devices comprise npn bipolar transistors (340 and 345). As shown in FIG. 4, the resistors (330 and 350) are coupled to the base of npn transistors (340 and 345), respectively.

Figure 5:
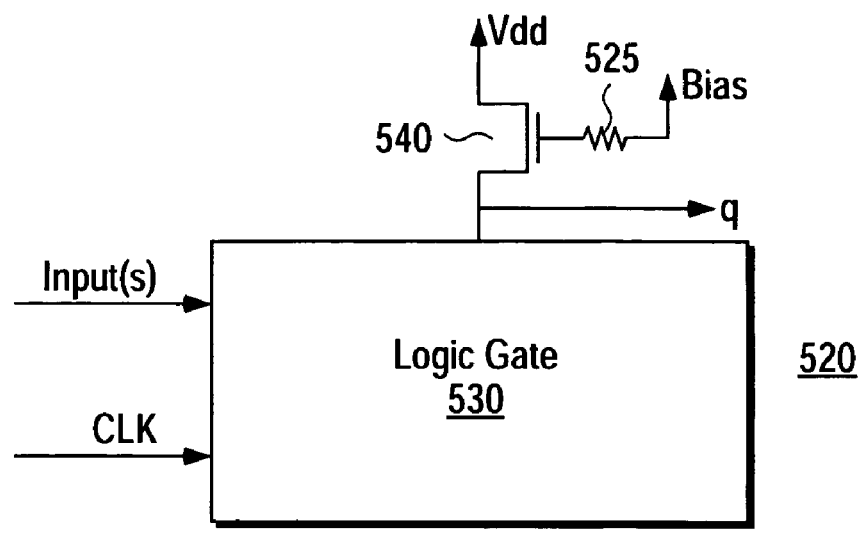
FIG. 5 illustrates one embodiment for introducing series inductance in a high-speed logic gate.

The shunt peaking technique of the present invention may also be implemented in single ended logic gates. FIG. 5 is a block diagram illustrating one embodiment for an active shunt peaking logic gate. For this embodiment, a logic gate 530, a single ended logic gate, receives at least one data input and a clock, and generates at least one output, q. Logic gate 530 may be configured to implement any well-known logic function, such as a latch or a MUX. Also, logic gate 530 may be configured using any logic family, such as CMOS. As shown in FIG. 5, the drain of MOS transistor 540 is coupled to the power supply voltage, $V_{dd}$, and the source of MOS transistor 540 is coupled to the logic gate 530 and the output, q. A resistor 525, coupled to the gate of MOS transistor 540, receives a bias voltage as shown in FIG. 5.

Figure 6:
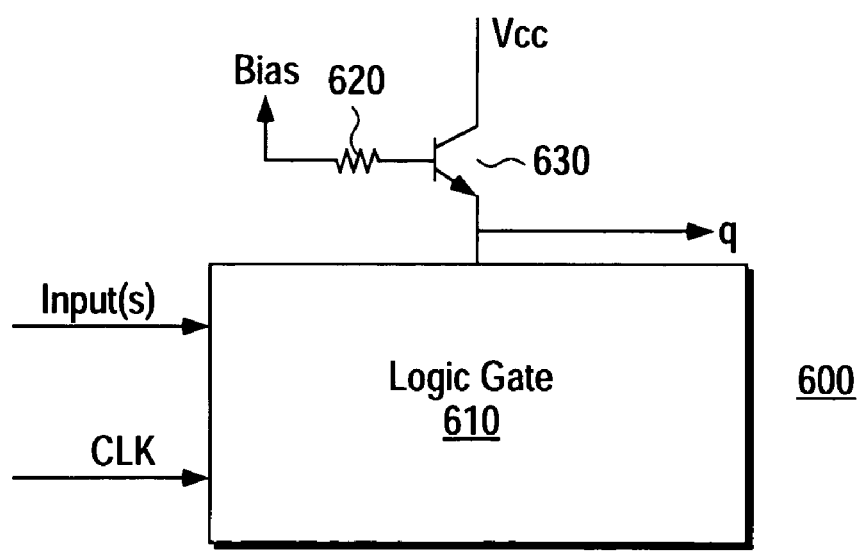
FIG. 6 illustrates a second embodiment for introducing series inductance in a high-speed logic gate.

FIG. 6 is a block diagram illustrating another embodiment for an active shunt peaking logic gate. As shown in FIG. 6, npn transistor 630 and resistor 620 are coupled to a logic gate 610. Specifically, the collector of transistor 630 is coupled to the power supply voltage, $V_{cc}$, the emitter of transistor 630 is coupled to the logic gate 610 and the output, q, and the base of transistor 630 is coupled to the resistor 620. The resistor 620 is coupled to a biasing voltage, Bias. Similar to logic gate 530, logic gate 610 may be configured to implement any logic function.

In one embodiment, the differential logic gate (e.g., 210, 310 and 325) and logic gate (e.g., 530 and 610) comprise a multi-stage logic gate. As used herein, a multi-stage logic gate connotes a gate that propagates an input signal through multiple circuits to implement multiple functions, or sub-functions, within a logic circuit. For example, a latch, which comprises both a set-up and hold function, constitutes a multi-stage logic circuit (e.g., the latch includes both a set-up circuit and a hold circuit). The multiple circuits of a multi-stage logic gate may include combinational or sequential logic circuits. In other embodiments, the differential logic gate (e.g., 210, 310 and 325) and logic gate (e.g., 530 and 610) comprise a single stage logic gate. For example, a single stage logic circuit may comprise an inverter, AND gate, OR gate, NOR gate, etc.

Figure 7:
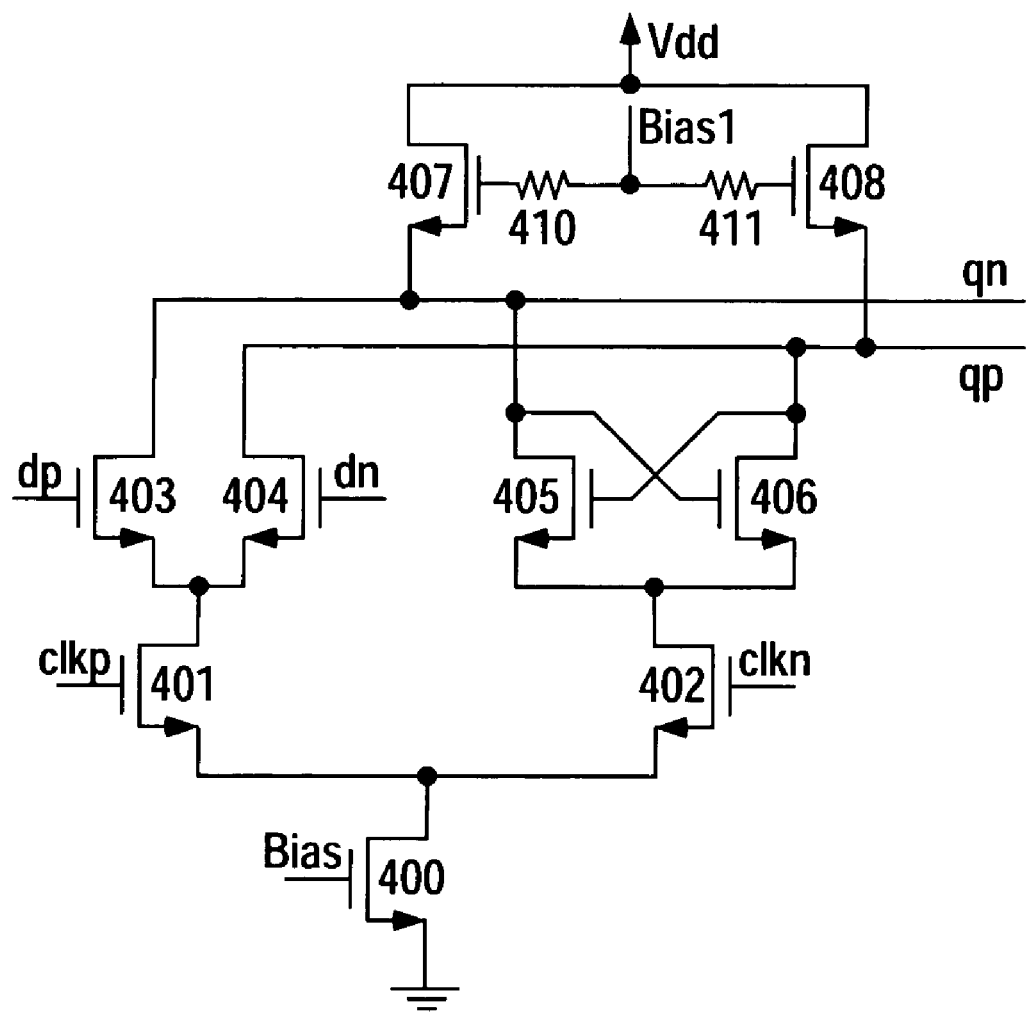
FIG. 7 illustrates one embodiment for use of the active shunt peak configuration for a latch.

FIG. 7 illustrates one embodiment for use of the active shunt peak configuration for logic gates. Specifically, FIG. 7 illustrates an example CML latch using an active shunt peaked load. In general, the active shunt peaked load enhances the bandwidth of the CML latch by increasing the operating frequency for the logic gate (e.g., ECL logic gates, CML logic gates, etc.). As shown in FIG. 7, the active shunt peaked load (resistors 410 and 411 and transistors 407 and 408) are coupled to the output lines of the latch, $q_n$ and $q_p$.

As shown in FIG. 7, the latch includes a cross-coupled transistor pair 405 and 406. The sources of the cross-coupled transistor pair (405 and 406) are coupled to the drain of MOS transistor 402. One of the differential clocks, $clk_n$, is input to the gate of transistor 402. Also, the drain of transistor 400 is coupled to the source of transistor 402. Differential inputs, $d_p$ and $d_n$, are input to the gates of MOS transistors 403 and 404, respectively. The drains of transistors 403 and 404 are coupled to the differential outputs of the latch, $q_n$ and $q_p$. The source of transistors 403 and 404 are coupled to the drain of transistor 401. Transistor 401 receives, at its gate, one of the differential clock signals, $clk_p$. The source of transistor 401 is coupled to the source of transistor 402 and to the drain of transistor 400. The gate of transistor 400 is biased with a constant voltage, "Bias", as shown in FIG. 7.

When differential clock $clk_p$ is in a high logic level, and $clk_n$ clock signal is in a low logic level, the cross coupled transistor pair, 405 and 406, do not latch the input data ($d_p$ and $d_n$), and thus the differential inputs $d_p$ and $d_n$ are propagated directly to the outputs of the latch, $q_p$ and $q_n$. Alternatively, when clock signal $clk_n$ attains a high logic level and clock signal $clk_p$ attains a low logic level, the latch (cross coupled transistors 405 and 406) holds the previous values presented on the differential output, $q_p$ and $q_n$.

During operation of the logic gate, the resistors (410 and 411) allow the gates of transistors 407 and 408 to move higher or lower through a transient coupling of the gate to source capacitance (i.e., a greater gate to source voltage is generated). A greater gate to source voltage causes an increase of current flow through the device. Also, a large voltage swing at the gates of transistors 407 and 408 results in faster switching of the transistors, similar to the properties exhibited by an inductor.

In the prior art, process variations in implementing the gain resistors in logic gates result in variations of the switching speed of the logic gates. The active shunt peaked logic gates of the present invention eliminate large amounts of process variations because the gain of the logic gates is based on a ratio of transistor sizes. Thus, the switching speed of the shunt peaked logic gate is insensitive to process variations from lot to lot.

The shunt peaked logic gate, unlike the prior art differential logic gates, decouples the relationship among the bandwidth of the logic gate, the DC gain of the logic gate, and the signal swing present at the output of the logic gate. The bandwidth of the shunt peaked logic gate is enhanced by increasing the size of the resistors. Although the resistors are increased, there is no impact on the DC performance of the logic gate. As a result, the bias current set in the logic gate may be based solely on the desired DC considerations of the gate. In turn, this independence allows for reduced power dissipation in the logic gate. The RC time constant, measured from the output of the logic gate, is now completely decoupled from the output voltage swing. This further permits design freedom to select device sizes without the requirement that the devices conduct additional current. Typically, a trade-off for increased bandwidth is increased power. The active shunt peaked logic gate of the present invention does not couple increased power with increased bandwidth.

Figure 8:
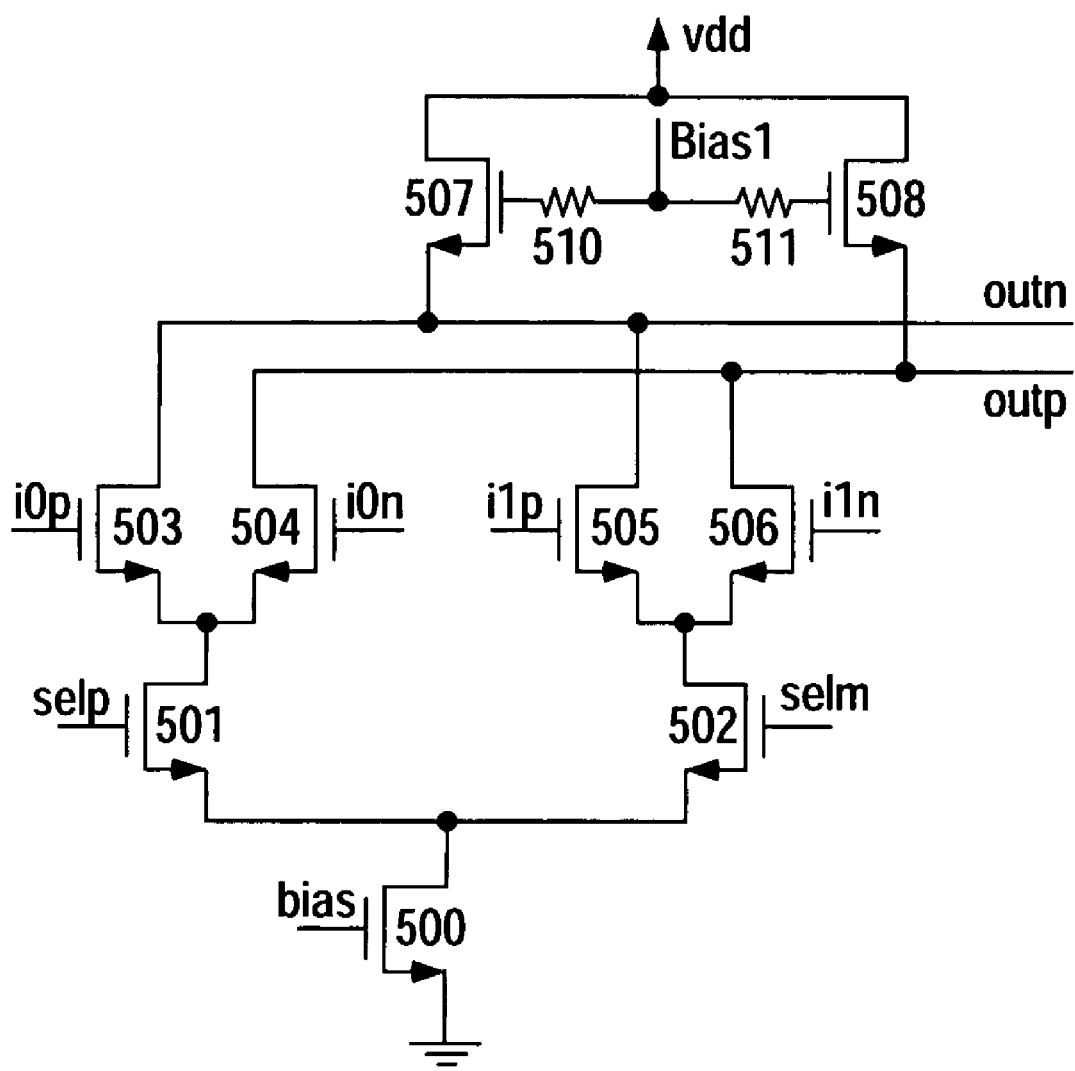
FIG. 8 illustrates another embodiment of a logic gate that implements the shunt peaked technique of the present invention.

FIG. 8 illustrates another embodiment of a logic gate that implements the shunt peaked technique of the present invention. For this embodiment, a two-to-one multiplexor is shown. The multiplexor includes resistors (510 and 511) coupled to the gates of transistors 507 and 508, respectively. Similarly, the source of MOS transistors 507 and 508 are coupled to the differential output lines, $q_n$ and $q_p$.

One issue associated with using active shunt-peaked circuits is that the transistors, implemented as load devices, exhibit poor large signal characteristics. As a result of the poor large signal characteristics, inter-symbol interference ("ISI") appears at the output of the active shunt-peaked circuit. For example, when an active shunt-peaked digital circuit (e.g., circuit 300 of FIG. 3 and circuit 500 of FIG. 5) is driven with non-return-to-zero ("NRZ") digital input signals, a large amount of ISI is produced at the circuit output. When a NRZ signal is corrupted by ISI, it is difficult for a receiver circuit to ascertain the difference between a high-level logic ("1") or a low level logic ("0") from the input data stream. Thus, in serial data communications applications, such as optical fiber communications, and chip-to-chip communications applications, minimization of ISI is paramount. The rate of change of a signal is dependent on the NRZ data pattern input to a logic gate. If a data pattern dependent rate exists at the output of a device, then ISI exists.

An example description of ISI generated from a latch is described in conjunction with FIG. 7. The production of ISI is also exhibited in devices, such as amplifiers. Although generation of ISI is described in conjunction with a latch, any circuit that employs an active shunt-peaked circuit and that receives large signal amplitude inputs, exhibits ISI. For this example, ISI is produced by an active shunt-peaked circuit when the input signal is large enough to completely switch the current into transistor 400 from either transistors 401 or 402. Under these conditions, current flowing through one of the load transistors (407 or 408) goes to zero if the current is completely switched into the other load transistor (e.g., if current is only conducting through transistor 407, then transistor 408 is completely switched off). For example, if a high-voltage is input to dp and a low voltage is input to dn, then the current flowing into transistor 400 is completely conducted by transistors 407 and 408. Under these conditions, the voltage at the output qn goes low, and the voltage at the output qp goes high. As the current in transistor 408 reduces to zero, the device turns off, entering the cut-off region of operation. If a transistor enters the cut-off region of operation, its impedance becomes very large. As a consequence, the rate of change of the rising voltage at the output, qn, becomes increasingly slow.

The presence of ISI is less problematic for small amplitude input signals. For example, an active shunt-peaked amplifier, which amplifies only low amplitude input signals, does not exhibit the ISI problem. Also, if the input signals to the circuit of FIG. 7, dp and dn, are small, then the current flowing into transistor 400 is not completely switched between transistors 401 and 402. As a result, the active shunt peaked loads (transistors 407 and 408) do not produce ISI because transistors 407 and 408 will never completely turn off. However, in other applications, active shunt-peaked circuits handle both small and large amplitude input signals (e.g., limiting amplifiers). Also, for active shunt-peaked logic gates, large ISI appears at the outputs. The present invention, as described herein, includes methods and apparatus for eliminating ISI for active shunt-peaked circuits that receive large voltage swings at their inputs.

The ISI, produced at the output of active shunt-peaked circuits, is extremely sensitive to the biasing voltage of the core circuit (e.g., bias voltage input to transistor 400 on FIG. 7 and bias voltage input to transistor 500 on FIG. 8). Conversely, the optimal tuning voltage is extremely sensitive to noise on the bias input voltage to the shunt-peaked devices (e.g., Bias1 on FIG. 7 and FIG. 8). The optimal tuning voltage is also sensitive to mismatch between nominally identical transistors of the shunt-peaked circuit. It is difficult to design a robust and manufacturable bias circuit that generates a bias voltage (e.g., Bias1 on FIG. 7 and FIG. 8) so that ISI is minimized.

Figure 9:
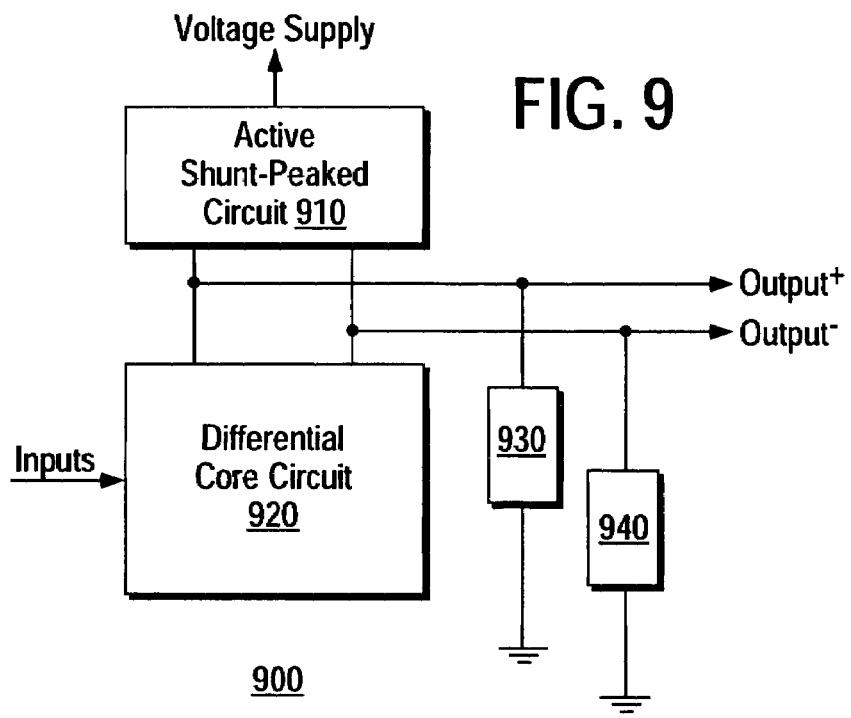
FIG. 9 is a block diagram illustrating one embodiment for an active shunt-peaked circuit with current sources.
Figure 10:
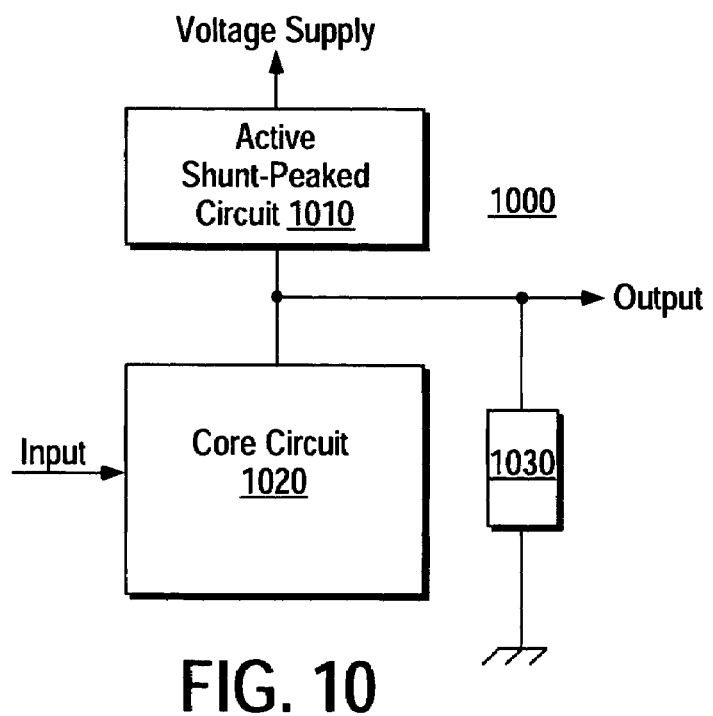
FIG. 10 is a block diagram illustrating another embodiment for an active shunt-peaked circuit with current sources.

The present invention may be used in both amplifiers and logic circuits that employ active shunt-peaked circuits. Current sources are used to guarantee that the active load devices for the active shunt-peaked circuit never operate in the transistor cut-off region. FIGS. 9 and 10 are block diagrams illustrating embodiments for active shunt-peaked circuits with current sources. Specifically, the embodiment of FIG. 9 depicts a differential circuit. A differential core circuit 920 receives a plurality of inputs (at least one differential input) and generates at least one differential-output, labeled output$^+$ and output$^-$ on FIG. 9. Differential core circuit 920 (FIG. 9) and core circuit 1020 (FIG. 10) may employ any type of logic gate, including multiplexors, latches, OR, AND or NOR gates. The output lines, output$^+$ and output$^-$, are coupled to active shunt-peaked circuit 910. The active shunt-peaked circuit 910 may be configured in accordance with any of the embodiments discussed above (e.g., FIGS. 3, 4, 5 and 6).

For this embodiment, circuit 900 also includes elements 930 and 940. Specifically, element 930 is coupled between output$^+$ and ground, and element 940 is coupled between output and ground. In general, elements 930 and 940 operate as current sources to guarantee that the active load devices, within active shunt-peaked circuit 910, never operate in the cut-off region of operation.

FIG. 10 illustrates a single ended active shunt-peaked circuit with a current source. Single ended circuit 1000 includes core circuit 1020 that receives at least one input and generates at least one output. Core circuit 1020 may comprise any type of circuit, including a logic gate or an amplifier. As shown in FIG. 10, active shunt-peaked circuit 1010 is coupled to the output of core circuit 1020. The element 1030, which operates as a current source, couples the output to ground. Similar to the embodiment of FIG. 9, element 1030 ensures that the load device(s) of active shunt-peaked circuit 1010 do not operate in the cut-off region.

In one embodiment, elements 930 and 940 (FIG. 9) and element 1030 (FIG. 10) are transistors (e.g., NMOS, PMOS, bipolar, etc.). In other embodiments, elements 930, 940, and 1030 are resistors. However, elements 930 and 940 (FIG. 9) and element 1030 (FIG. 10) may comprise any device that guarantees the load devices of the active shunt-peaked circuit never enter the cut-off region of operation.

Figure 11:
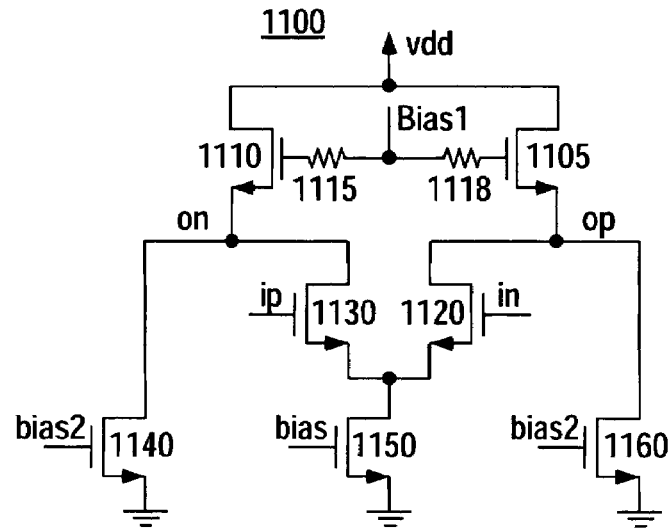
FIG. 11 illustrates an amplifier with a shunt-peaked circuit and corresponding current sources.

FIG. 11 illustrates another embodiment for a shunt-peaked circuit with corresponding current sources. For this embodiment, an amplifier includes an active shunt-peaked circuit. For this embodiment, the amplifier includes transistors 1120 and 1130 that receive differential inputs, ip and in. The shunt-peaked circuit comprises NMOS transistors 1110 and 1105 as well as resistors 1115 and 1118, coupled to the gates of NMOS transistors 1110 and 1105. The bias voltage, Bias1, is input to resistors 1115 and 1118 as shown in FIG. 11. Transistors 1140 and 1160 are configured to operate as current sources. The transistors 1140 and 1160 are biased, with bias2 voltages, so that the transistors conduct currents that are much smaller than current flowing in transistor 1150. In addition, transistors 1140 and 1160 are sized so that the parasitic capacitances and conductances at the output nodes, op and on, due to transistors 1140 and 1160, are much smaller than the parasitic capacitances and conductances generated from transistors 1150, 1130, 1120, 1110, and 1105. Based on these characteristics, transistors 1140 and 1160 have little affect on the small signal characteristics of the amplifier (i.e., gain, bandwidth, and output impedance). The transistors 1140 and 1160 guarantee that the load devices of the shunt-peaked circuit, transistors 1110 and 1105, never fully turn off, even if the current flowing through transistor 1150 is fully switched into either transistor 1130 or 1120. Because of this, ISI at the output of the amplifier is minimized regardless of the amplitude of the input signal. In addition, the ISI becomes insensitive to bias voltage, "bias", input to the gate of transistor 1150, and to bias voltage "Bias1" at resistors 1115 and 1118.

Figure 12:
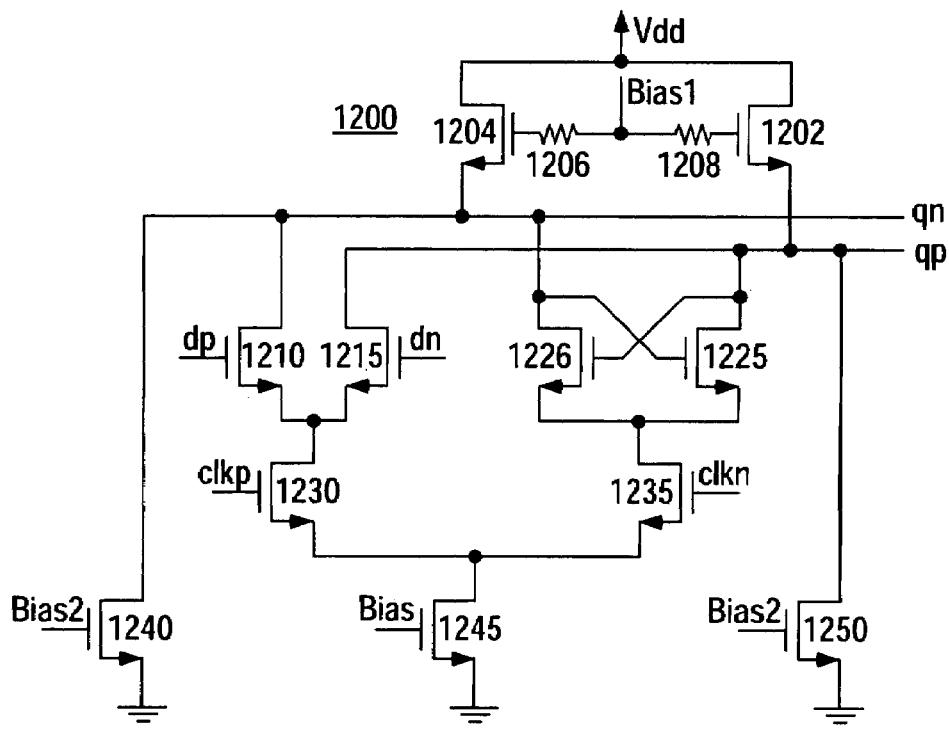
FIG. 12 illustrates one embodiment for an active shunt-peaked latch with corresponding current sources.

FIG. 12 illustrates one embodiment for an active shunt-peaked latch with corresponding current sources. The basic operation of a CML latch is described above in conjunction with a description of FIG. 7. For this embodiment, the active shunt-peaked circuit includes NMOS transistors 1204 and 1202 with resistors 1206 and 1208 coupled to the gates of the transistors, respectively. The current sources for circuit 1200 include NMOS transistors 1240 and 1250, biased by voltage Bias2. Transistors 1240 and 1250 are biased as current sources with currents that conduct much less current than the current flowing in transistor 1245. In addition, transistors 1240 and 1250 are sized so that the parasitic capacitances and conductances generated by them on the output nodes, qn and qp, are small compared to the parasitic capacitances and conductances contributed from the latch transistors (i.e., transistors 1230, 1235, 1210, 1215, 1220, 1225 and 1245). Transistors 1240 and 1250 guarantee that load devices, transistors 1204 and 1202, never turn off completely regardless of the logic inputs applied to the latch (dp and dn). Thus, circuit 1200 exhibits minimal ISI at the outputs. In addition, the presence of ISI is insensitive to the bias voltage "bias" input to transistor 1245 and to the voltage "Bias1" at resistors 1206 and 1208.

Although the present invention has been described in terms of specific exemplary embodiments, it will be appreciated that various modifications and alterations might be made by those skilled in the art without departing from the spirit and scope of the invention.

What is claimed is:

1. A circuit comprising:
   at least one output line;
   active shunt-peaked circuit, coupled to said output line, comprising at least one load transistor for generating an inductance;
   core circuit, coupled to said output line, for receiving at least one signal, for processing said signal, and for generating at least one output signal on said output line; and
   current source, coupled to said output line, for preventing said load transistor from entering a cut-off region of operation.

2. The circuit as set forth in claim 1, wherein said current source comprises a transistor, coupled between said output line and ground, and coupled to receive a bias voltage.

3. The circuit as set forth in claim 1, wherein said current source comprises a resistor coupled between said output line and ground.

4. The circuit as set forth in claim 1, wherein:
   at least one output line comprises differential output lines;
   said active shunt-peaked circuit, coupled to said differential output lines, comprises a plurality of load transistors, one for each differential output line;
   said core circuit, coupled to said differential output lines, for receiving differential signals, for processing said differential signals, and for generating at a differential output signal on said differential output lines;

said current sources comprising a current source for each differential output line; and coupled to said differential output lines for preventing said load transistors from entering a cut-off region of operation.

5. The circuit as set forth in claim 1, wherein said core circuit comprises a logic gate.

6. The circuit as set forth in claim 1, wherein said core circuit comprises an amplifier.

7. The circuit as set forth in claim 1, wherein said shunt-peaked circuit comprises:

at least one resistive element; and at least one transistor, coupled to said resistive element and coupled to said output line, such that said transistor couples said output line to a power supply input.

8. The circuit as set forth in claim 1, wherein said circuit comprises metal oxide semiconductor (MOS) transistors configured using current-mode logic.

9. The circuit as set forth in claim 1, wherein said circuit comprises bipolar transistors configured using emitter-coupled logic.

10. A method for reducing inter symbol interference in a circuit, said method comprising:

coupling an active shunt-peaked circuit to an output line;

generating an inductance from at least one load transistor;

coupling a core circuit to said output line;

receiving at least one signal at said core circuit;

processing said signal at said core circuit;

generating at least one output signal on said output line; and preventing said load transistor from entering a cut-off region of operation.

11. The method as set forth in claim 10, wherein preventing said load transistor from entering a cut-off region of operation comprises:

coupling a transistor between said output line and ground; and configuring said transistor to receive a bias voltage.

12. The method as set forth in claim 10, wherein preventing said load transistor from entering a cut-off region of operation comprises coupling a resistor between said output line and ground.

13. The method as set forth in claim 10, wherein:

coupling an active shunt-peaked circuit to an output line comprises coupling an active shunt-peaked circuit to differential output lines;

generating an inductance from at least one load transistor comprises generating an inductance from a plurality of load transistors, one for each differential output line;

receiving at least one signal at said core circuit comprises receiving differential signals;

processing said signal at said core circuit comprises processing said differential signals;

generating at least one output signal on said output line comprises generating at a differential output signal on said differential output lines; and preventing said load transistor from entering a cut-off region of operation comprises preventing said load transistors from entering a cut-off region of operation.

14. The method as set forth in claim 10, wherein said core circuit comprises a logic gate.

15. The method as set forth in claim 10, wherein said core circuit comprises an amplifier.

16. The method as set forth in claim 10, wherein said shunt-peaked circuit comprises:

at least one resistive element; and at least one transistor, coupled to said resistive element and coupled to said output line, such that said transistor couples said output line to a power supply input.

17. The method as set forth in claim 10, wherein said circuit comprises metal oxide semiconductor (MOS) transistors configured using current-mode logic.

18. The method as set forth in claim 10, wherein said circuit comprises bipolar transistors configured using emitter-coupled logic.

* * * * *